United States Patent [19]
Truong

[11] Patent Number: 5,214,320
[45] Date of Patent: May 25, 1993

[54] SYSTEM AND METHOD FOR REDUCING GROUND BOUNCE IN INTEGRATED CIRCUIT OUTPUT BUFFERS

[75] Inventor: Ho D. Truong, San Jose

[73] Assignee: Smoj Systems, Inc., San Jose, Calif.

[21] Appl. No.: 897,729

[22] Filed: Jun. 12, 1992

[51] Int. Cl.$^5$ ............................................. H03K 17/16
[52] U.S. Cl. ................................. 307/443; 307/246.8;
307/451; 307/263
[58] Field of Search ....................... 301/443, 451, 475;
307/263, 296.8

[56] References Cited

U.S. PATENT DOCUMENTS

| | | | |
|---|---|---|---|
| 4,473,762 | 9/1984 | Iwahashi et al. | 307/443 X |
| 4,499,387 | 2/1985 | Konishi | 307/443 |
| 4,638,187 | 1/1987 | Boler et al. | 307/451 |
| 4,638,191 | 1/1987 | Baumgartner et al. | 307/443 X |
| 4,777,389 | 10/1988 | Wu et al. | 307/443 |
| 4,820,942 | 4/1989 | Chan | 307/542 |
| 4,857,770 | 8/1989 | Partovi et al. | 307/451 |
| 4,975,599 | 12/1990 | Petrovick, Jr. et al. | 307/263 X |
| 5,012,141 | 4/1991 | Tomisawa | 307/451 X |
| 5,017,807 | 5/1991 | Kriz et al. | 307/443 |
| 5,021,684 | 6/1991 | Ahuja et al. | 307/443 |
| 5,081,380 | 1/1992 | Chen | 307/591 |
| 5,118,971 | 6/1992 | Schenck | 307/443 |

Primary Examiner—David R. Hudspeth
Attorney, Agent, or Firm—Sterne, Kessler, Goldstein & Fox

[57] ABSTRACT

A system and method for reducing the amount of ground bounce in output buffer circuits. The invention includes a first control circuit to control the amount of time it takes for a pull-up FET to be turned on, and thus the amount of time it takes for an output signal of the output buffer circuit to transition from a low to a high state. The invention also includes a second control circuit to control the amount of time it takes to turn on a pull down FET and thus the amount of time it takes for the output signal of the output buffer circuit to transition from a high to a low state. First and second control circuits each include an additional FET for controlling the amount of current supplied to the pull-up and pull-down FET, respectively. Each additional FET is driven by a voltage reference signal which is above the threshold of the additional FET. Thus, the additional FET is not fully on or off, but introduces a resistance into the control circuit, thus decreasing the amount of current supplied to the pull-up and pull-down FETs. Since the current amount of current provided to the final output FETs is reduced, their turn-on time is slower and thus the switching time of output buffer circuit is increased. As a result, the magnitude of ground bounce introduced by the output buffer circuit according to the present invention is significantly reduced.

11 Claims, 5 Drawing Sheets

SYSTEM AND METHOD FOR REDUCING GROUND BOUNCE IN INTEGRATED CIRCUIT OUTPUT BUFFERS

BACKGROUND OF THE INVENTION

1. Field of the Invention

The invention relates generally to high-speed integrated circuit output buffer circuits, and more particularly to a system and method for reducing the amount of ground bounce introduced by integrated circuit output buffer circuit operation.

2. Related Art

Integrated circuits are commonplace in contemporary electronic and computer-related equipment. Such equipment often comprises multiple integrated circuits interfaced to each other via data busses or other signal paths. Interface specifications for various logic families in use delineate voltage and current levels required for digital signals to be transferred between two or more integrated circuits.

To meet these interface specifications, integrated circuits use an output buffer circuit to drive a logic-low or logic-high signal across the signal path. Output buffer circuits are also used as a way of interfacing one logic type of an integrated circuit to a second logic type of a second integrated circuit.

Output buffer circuits use a voltage level, Vcc, as a source of the logic high level. Vcc is typically 3.0 to 5.5 volts (which is usually positive), depending on the technology used. The supply voltage for Vcc is typically introduced into the integrated circuit at an integrated circuit package pin. The integrated circuit package pin is connected to a pad on the microcircuit chip by a bond wire, so as to provide the Vcc to the microcircuit chip. The Vcc is distributed throughout the microcircuit on a (power) bus or other signal path as an internal Vcc supply.

Output buffer circuits use a system ground (GND) as a sink for a logic low output. GND is also introduced into the integrated circuit at an integrated circuit package pin and connected to a pad on the microcircuit chip by a bond wire. GND is distributed throughout the microcircuit chip on a (power) bus or other signal path.

Inherent in the bond wires and integrated circuit pins that interface to the microcircuit are a capacitance, resistance and inductance. These characteristics are affected by design selections such as wire and pin length, thickness, and materials.

Output buffer circuits typically use two field effect transistors (FETs) connected to an output terminal. A first FET is a p-channel pull-up transistor, whose source is connected to Vcc, and whose drain is connected to the output terminal.

A second FET is an n-channel pull-down transistor, whose drain is connected to the output terminal, and whose source is connected to ground.

An input data signal controls each FET at its gate via control logic. To output a logic high signal, the pull-up (first) FET is turned on by the control logic, and the pull-down (second) FET is turned off. Output switching to this high state allows current to flow from Vcc to the output terminal via the first FET, and puts the pull-down (second) FET in a high-impedance state so that no output signal current may flow through it to GND.

To output a logic low signal, pull-up (first) FET is turned off, thus presenting a high resistance between Vcc and the output terminal. In this low state, no current will flow from Vcc to the output terminal. Simultaneously, pull-down (second) FET is turned on, thus allowing current to pass from the output terminal to GND. As a result, the output buffer circuit acts as a sink for current, and the output signal is a logic low signal.

Thus, it can be seen that to transition the signal at the output terminal from one state to another state requires switching one of the FETs on while switching the other FET off.

As contemporary systems are advancing to offer greater performance in terms of speed, microcircuit technology has seen the emergence of sub-micron technology. Microcircuits using sub-micron technology inherently have much faster transition times than previous technologies due to the smaller channel length dimensions of the fabricated devices. Although faster transition times are beneficial for increasing circuit speed, faster transition times result in sudden surges of current in the course of changing state. Sudden surges in current result in what are commonly known as current spikes. Thus, rapid switching of the pull-up and pull-down FETs results in current spikes on the output during a time period immediately following a change of state.

Additionally, during output switching, charging and discharging currents are generated from the FETs to a load capacitance ($C_L$) present at the output.

These currents (current spikes and charging and discharging currents), which appear during output switching, are known as transient currents. These transient currents are present on the Vcc and GND, and induce corresponding voltage transients (also called switching noise) on Vcc and GND.

The switching noise causes the integrity of the logic high and logic low states of the output buffer circuit to be degraded. This undesirable noise is commonly referred to as ground bounce. If severe enough, such degradation results in interface problems among the output buffer circuit and other ICs to which it interfaces. The interface problems occur when the degradation causes the logic low and logic high states of the output buffer circuit to be out of specification.

In most integrated circuits, the problem of ground bounce is compounded by simultaneous switching of multiple output buffer circuits. Most integrated circuits have such simultaneous switching because of the use of parallel bus structures. The direction of the technology is toward even wider parallel bus structures. Ground bounce becomes more severe as more output buffers switch simultaneously.

SUMMARY OF THE INVENTION

The present invention is an output buffer circuit and method which provides reduced ground bounce. Reduction in ground bounce is accomplished by increasing the amount of time it takes for an output signal to transition (output switching time) from one logic state to the other logic state. In other words, the output switching time is increased. Output switching time is increased by decreasing the amount of current available to turn on pull-up and pull-down FETs used to drive the output signal. The pull-up FET and the pull-down FET comprise the final output FETs. In other words, the gate drive of the final output FETs is controlled.

The output buffer circuit according to the present invention comprises an n-channel pull-up FET that can be turned on to drive the output signal to a high state, and an n-channel pull-down FET that can be turned on to drive the output signal to a low state. The amount of gate drive provided at the gates of the final output FETs is separately controlled to control the rate at which the final output FETs are turned on, thus controlling the transition time of the output signal.

The gate drive of the pull-up FET is controlled through the use of a first control circuit. The first control circuit uses a reference voltage signal to control the amount of current sent to the gate of the pull-up FET. The first control circuit includes two p-channel FETs and an n-channel FET connected in series. A first p-channel FET is coupled between Vcc and the second p-channel FET. The n-channel FET is coupled between the second p-channel FET and GND. An output of the first control circuit is coupled to the drain of the second p-channel FET. This output is used to drive the pull-up FET to the on state (corresponding to the high state output signal) and to the off state (corresponding to the low state output signal).

The output of the first control circuit is high when the two p-channel FETs are turned on and the n-channel FET is turned off. In this state, current flows from Vcc through both p-channel FETs to the gate of the pull-up FET. Alternatively, the output of first control circuit is low when the two p-channel FETs are turned off and the n-channel FET is turned on.

An inverted data signal is provided to the gate electrodes of the first p-channel FET and the n-channel FET. The reference voltage signal is provided to the gate of the second p-channel FET. When the inverted data signal transitions from high to low, the first p-channel FET is turned on and the n-channel FET is turned off. If the reference voltage signal is low, the second p-channel FET is turned on, and current flows from Vcc through both p-channel FETs to the gate of the pull-up FET. This current charges the gate of the pull-up FET to a voltage above its threshold. Above threshold, pull-up FET turns on, thus driving the output signal to a high state.

As the reference voltage is increased, the amount of resistance introduced by the second p-channel FET is also increased. An increase in the resistance of the second p-channel FET limits the output current of the first control circuit. This, in turn, limits the amount of charging current available at the gate of the pull-up FET. This results in a slower turn-on time of the pull-up FET, and hence a slower transition of the output signal from a low state to a high state.

The amount of charging current available at the gate of the pull-down FET is controlled in a similar fashion by a second control circuit. Thus, the structure and operation of the second control circuit is not described here.

With regard to the present invention as a whole, the reference voltage signal is generated using a reference voltage generator circuit. The reference voltage signal is a function of Vcc and the characteristics of the semiconductor material.

Further features and advantages of the present invention, as well as the structure and operation of various embodiments of the present invention, are described in detail below with reference to the accompanying drawings. In the drawings, the left-most digit of a reference number identifies the drawing in which the reference number first appears.

DETAILED DESCRIPTION OF THE PRESENT INVENTION

Figure 1A:
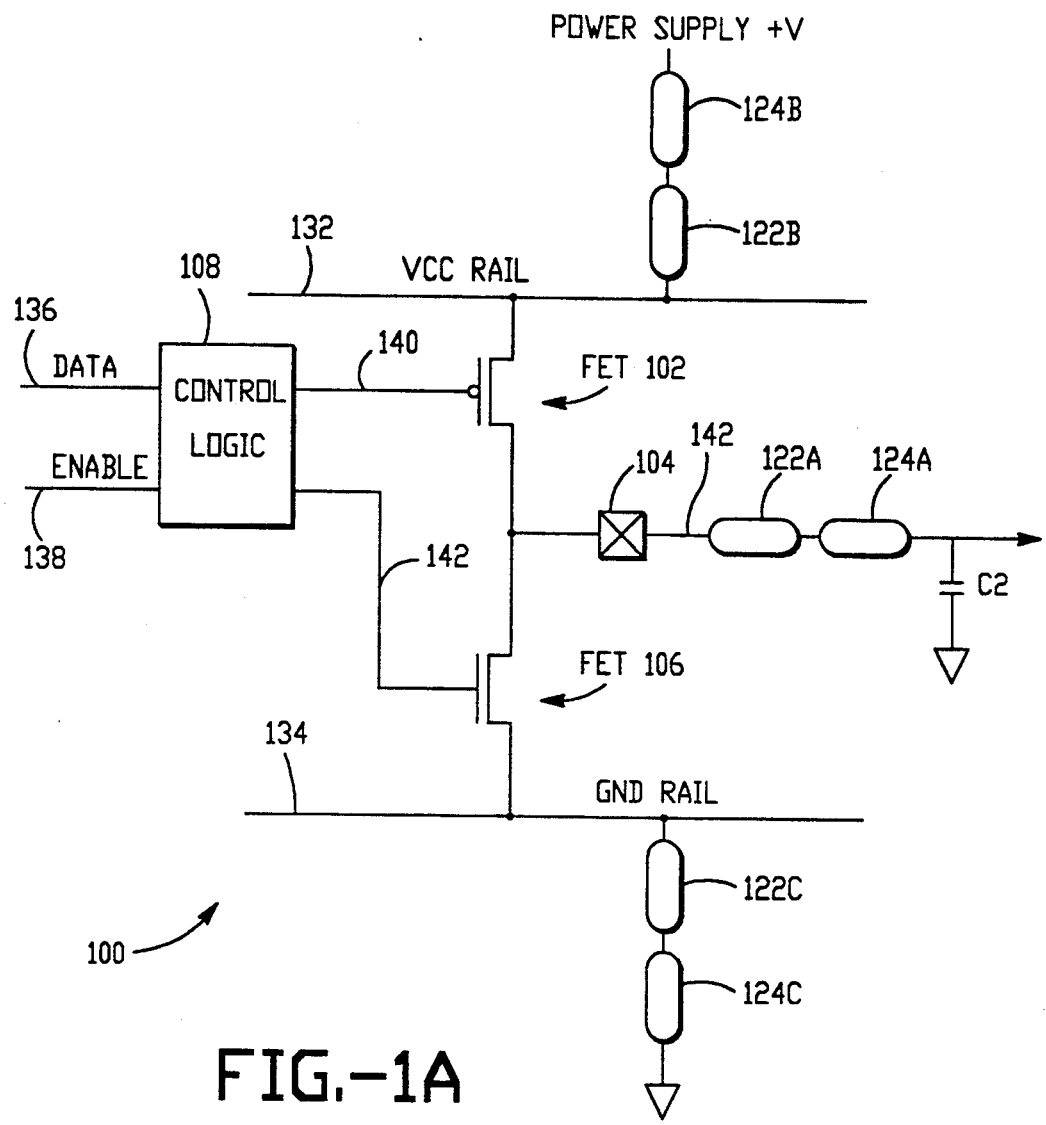
FIG. 1A is a circuit diagram illustrating a conventional output buffer circuit.

Table of Contents
1. Introduction
2. An Overview of Output Buffer Circuits
3. An Embodiment of the Present Invention for use with 5.0 Volt Systems.
4. Example Embodiment for use with 3.0 Volt Systems
5. A Complete Output Buffer Circuit According to the Present Invention.
6. Implementation of the Output Buffer Circuit 1. Introduction The present invention minimizes ground bounce by increasing the amount of time it takes for the output buffer to transition its output signal from one state to another (transition time). Such an increase in time is accomplished by limiting the amount of gate drive available to turn on pull-up and pull-down FETs (final output FETs) of the output buffer circuit that are used to drive a high state and a low state output signal, respectively.

The magnitude of noise, or ground bounce, introduced at Vcc or ground is as follows:

$$V_L = LC_L \frac{d^2V_0(t)}{d^2t} \tag{1}$$

where:

$V_L$ = ground bounce—transient voltage at Vcc or ground;

L = inductance at Vcc or ground;

$d^2V_0(t)/d^2(t)$ = 2nd derivative of voltage with respect to time; and $C_L$ = total loading capacitance at an output pin.

Thus, systems using fast switching times experience more severe ground bounce problems. In addition, simultaneous switching of multiple output buffer circuits has an additive effect that compounds the magnitude of ground bounce, $V_L$, present at Vcc and GND.

To minimize ground bounce, one should minimize L, $C_L$, and $d^2V_0(t)/d^2(t)$. Minimization of L can be accomplished by package design practices, such as, for example, minimizing the length of the bond wire, and properly selecting materials for the package pin. The inductance L of the bond wires and pins is constrained by layout requirements and cost considerations. Thus, L can only be minimized to a certain extent.

$C_L$ is dependent on the integrated circuit device to which the present circuit is interfacing, and also dependent on the path taken by the output signal. As was the case with L, the reduction of $C_L$ is constrained by layout and cost considerations. In addition, $C_L$ is a factor of an external integrated circuit which in some cases may not be controllable at all. Thus, it is difficult to minimize $C_L$.

Minimization of $d^2V_0(t)/d^2(t)$ has a large effect. There is a tradeoff, however, when minimizing $d^2V_0(t)/d^2(t)$. The tradeoff is between obtaining on one hand a high speed, high current output buffer circuit, and on the other hand minimizing ground bounce. In other words, to minimize ground bounce by minimizing $d^2V_0(t)/d^2(t)$, results in a sacrifice of system performance.

The present invention focuses on $d^2V_0(t)/d^2(t)$ to minimize ground bounce. More specifically, the present invention limits current flow in the final output FETs, thereby minimizing $d^2V_0(t)/d^2(t)$. This brings the magnitude of the ground bounce to an acceptable level. As d(t) is increased, the amount of ground bounce introduced is decreased.

2. An Overview of Output Buffer Circuits

FIG. 1A is a circuit diagram illustrating a conventional output buffer circuit 100. Referring to FIG. 1A, conventional output buffer circuit 100 will now be described. A pull-up transistor 102 (referred to as 'pull-up FET 102') is typically a p-channel device. When pull-up FET 102 is turned on, current from an internal Vcc source 132 (referred to as 'Vcc 132') flows to an output pad 104 of the microcircuit. Output pad 104 is connected to a pin of the integrated circuit package by way of a bond wire.

A pull-down transistor 106 (referred to as 'pull-down FET 106') is typically an n-channel device. When pull-down FET 106 is turned on, current flows from output pad 104 to an internal ground 134 (referred to as 'GND 134').

Control logic 108 receives an enable signal 138 and an data 136 (referred to as 'data 136'). Based on these inputs, control logic 108 outputs two signals representative of data 136 on lines 140,142. Line 140 and line 142 represent data 136. When control logic 108 is enabled, a high data 136 results in a low on line 140 and on line 142. Likewise, a low on data 136 when control logic 108 is enabled, results in a high on line 140 and on line 142.

A high on line 140 and on line 142 turns on pull-down FET 106 and turns off pull-up FET 102. Thus, this condition will cause output buffer circuit 100 to drive a low state output signal 142 at output pad 104. Similarly, a low on line 140 and on line 142 turns off pull down FET 106 and turns on pull-up FET 102. This condition causes output buffer circuit 100 to drive a high state output signal 142 at pad 104.

Output pad 104 serves as an interface point between output buffer circuit 100 and the integrated circuit package. A bond wire 122A is used to provide an interface from pad 104 to a pin 124A of the integrated circuit in which output buffer circuit 100 resides. Both bond wire 122A and pin 124A have an inherent resistance, capacitance and an inductance. Pin 124A is connected to other components and interconnect which results in a capacitive load $C_L$.

Similarly, Vcc 132 and GND 134 are interfaced to an external voltage and ground source using a Vcc bond wire 122B and GND bond wire 122C, respectively, and using a Vcc pin 124B and a GND pin 124C, respectively. These elements also have inherent resistive, capacitive, and inductive characteristics.

Figure 1B:
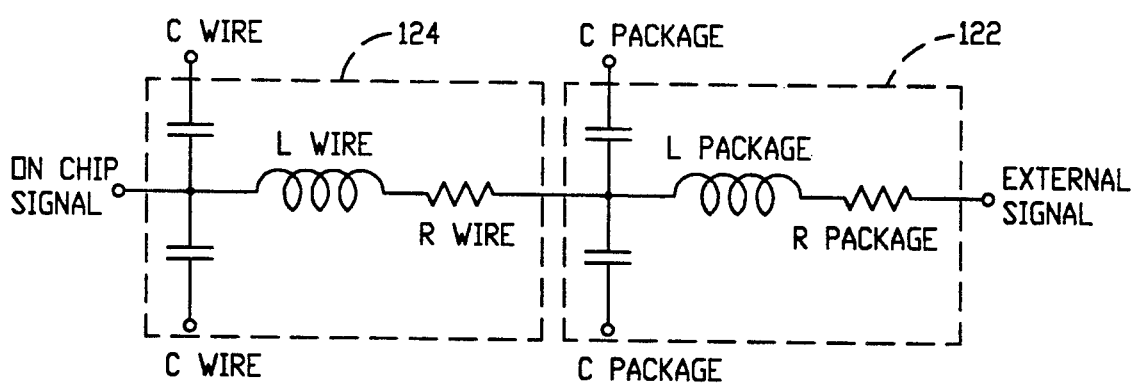
FIG. 1B illustrates a model of capacitance, resistance, and inductance inherent in integrated circuit bond wires and package pins.

FIG. 1B illustrates a model of the capacitance, resistance, and inductance inherent in bond wires 122A,122B,122C and pins 124A,124B,124C.

3. An Embodiment of the Present Invention for use with 5.0 Volt Systems.

The technique of the present invention is to minimize ground bounce by increasing the amount of time it takes for the output buffer to transition its output signal from one state to another. Reduction of ground bounce is accomplished by using a reference voltage signal to control the amount of current provided to the pull-up and pull down FETs of the output buffer circuit.

Figure 2:
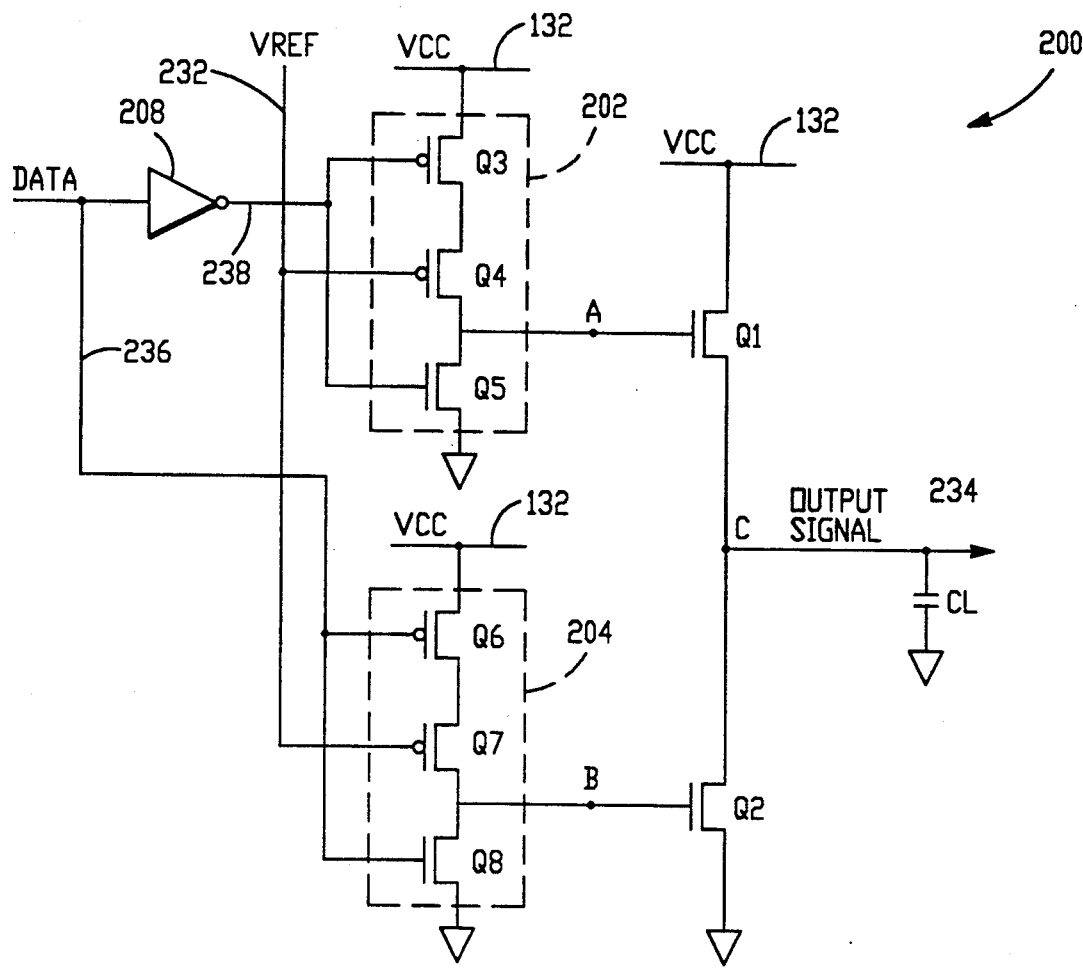
FIG. 2 is a schematic diagram illustrating an output buffer circuit for minimizing ground bounce according to a first embodiment of the present invention.

FIG. 2 is a schematic diagram illustrating an output buffer circuit 200 (referred to as output buffer 200) for minimizing ground bounce according to the present invention. Referring to FIG. 2, output buffer 200 of the present invention will now be described according to a first alternative embodiment. First to be described is the technique of using a reference voltage to slow the switching times of output buffer pull-up and pull-down FETs. This description is followed by a more detailed discussion on the operation of output buffer circuit 200 and creation of the reference voltage.

Output buffer 200 includes an n-channel pull-up transistor Q1, and an n-channel pull-down pull-down transistor Q2. To output a high output signal 234 from output buffer 200, pull-up transistor Q1 is turned on and pull-down transistor Q2 is turned off. To output a low output signal 234, pull-down transistor Q2 is turned on and pull-up transistor Q1 is turned off. Pull-up transistor Q1 is turned on and off using a control circuit 202. Similarly, pull-down transistor Q2 is turned on and off using a pull-down control circuit 204.

Pull-up transistor Q1 is turned on by applying a high signal at its gate. Pull-down transistor Q2 is turned on by applying a high signal at its gate. A reference voltage signal 232 (referred to as 'Vref 232') is used to control the amount of charging current provided to nodes A and B. The amount of charging current provided to nodes A and B affects the speed at which a voltage builds up at those nodes. This in turn affects the time it takes to turn on transistors Q1 and Q2 and thus the rise and fall times of output signal 234. Essentially, less switching current at nodes A and B means that a voltage builds more slowly. If, for example, the voltage at node A builds slowly, pull-up transistor Q1 will gradually turn on, allowing more and more current to pass from Vcc 132. The gradual turn on of pull-up transistor Q1 results in a gradual (slower) transition of output signal 234 from a low to a high level.

Similarly, if the charge at node B is caused to build slowly, pull-down transistor will turn on more gradually. This will result in a slower transition of output signal 234 from a high to a low level.

The technique of increasing the transition time of output signal 234 by using Vref 232 will now be described in detail. The technique will be described first for the case of a high-to-low transition, and then for the case of a low-to-high transition.

When output signal 234 is to make a high-to-low transition, pull-up transistor Q1 is turned off and pull-down transistor Q2 is turned on. The faster pull-down transistor Q2 is turned on, the faster output signal 234 transitions from high-to-low. Thus to increase the transition time of output signal 234 from high-to-low, the time to turn on pull-down transistor Q2 is increased. As discussed above, this is accomplished by limiting the current flow from the gate of pull-down transistor Q2 to GND.

Control circuit 204 is used to limit the current flow at node B. The operation of control circuit 204 will now be described. Data 236 represents the data to be output by output buffer circuit 200. Data 236 is input to the gate of transistors Q6,Q8, and Vref 232 is input to the gate of transistor Q7. Assuming momentarily that Vref 232 is low, transistor Q7 is turned on. When data 236 is a low, transistor Q6 is turned on and transistor Q8 is off. Current from Vcc 132 is passed through transistors Q6,Q7 (both on) to node B. This current turns on transistor Q2 and output signal 234 transitions to a low. Since, in this example, data 236 is low, transistor Q8 is off and has no impact on node B.

To limit the amount of current at node B, Vref 232 is applied to transistor Q7. As Vref 232 is increased, transistor Q7 presents an increasing amount of resistance into the path between Vcc 132 and node B. As a result, transistor Q7, acts as a variable resistor, limiting the amount of current at node B.

For the case of output signal 234 transitioning from a low to a high, pull-up transistor Q1 is turned on and pull-down transistor Q2 is turned off. The faster pull-up transistor Q1 is turned on, the faster output signal 234 transitions from low to high. To increase the amount of time it takes for output signal 234 to transition from low to high, the amount of time it takes to turn on pull-up transistor Q1 should be increased. This can be accomplished by limiting the amount current provided to the gate of pull-up transistor Q1.

Limiting the charging current at node A is accomplished using control circuit 202 in a manner similar to the manner in which current is limited at node B. Control circuit 202 comprises transistors Q3,Q4,Q5. Data 236 is inverted in an inverter 208. Inverted data 238 is input to the gates of transistors Q3,Q5, and Vref 232 is input to the gate of transistor Q4. When data 236 is high, inverted data 238 turns on transistor Q3 and turns off transistor Q5. Thus if data 236 is high and Vref 232 is low, current flows from Vcc 132 to node A and pull-up transistor Q1 is turned on. To minimize the amount of current provided to node A, Vref 232 is increased. An increased Vref 232 results in transistor Q4 presenting an increased series resistance between Vcc 132 and node A. Thus Q4 acts to limit the amount of current provided to node A.

Selection of the voltage level of Vref 232 allows the rise and fall times of output signal 234 to be adjusted. As Vref 232 is increased, the rise and fall times of output signal 234 are increased. As Vref 232 is decreased, the rise and fall times of output signal 234 are decreased. Thus by adjusting Vref 232, the system can be optimized to deliver the fastest performance possible, while limiting the amount of ground bounce introduced into Vcc 132 and GND 134.

Figure 3:
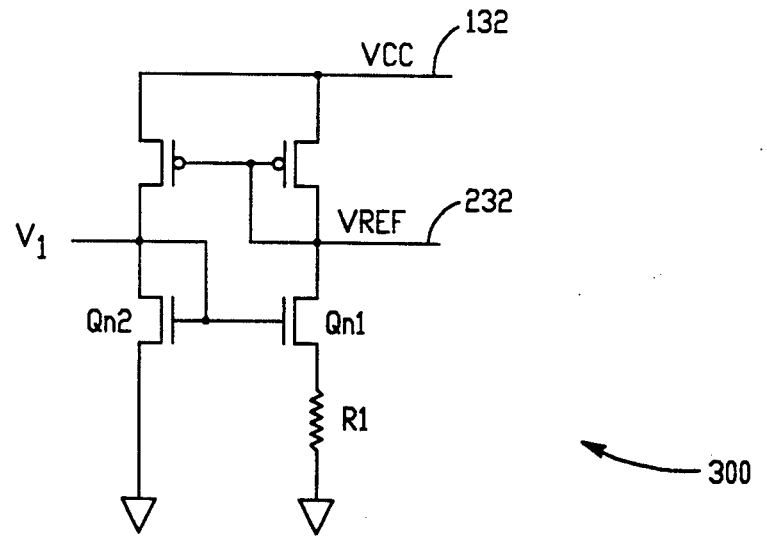
FIG. 3 is a schematic diagram illustrating a reference voltage generator circuit used to generate Vref.

FIG. 3 illustrates a circuit used to generate Vref 232. Referring to FIG. 3, the generation of Vref 232 will now be described. A reference voltage generator 300 generates Vref 232. As will be described, Vref 232 is a function of Vcc 132 and a gate voltage V1 332 (referred to as 'V1 332').

V1 332 is inversely proportional to the gain factor K' of an FET. More specifically, a first-order approximation for V1 332 can be expressed in terms of K', A resistance, R1, and a threshold voltage, $V_t$ of n-channel transistors Qn1,Qn2 (assumed for this approximation that $V_t$ of Qn1 is equal to $V_t$ of Qn2.

$$V_1 = \frac{1}{K'R1} + V_t \tag{2}$$

The gain factor K' is a function of the mobility $\mu_0$, the dielectric constant $\epsilon_0$, and the oxide thickness $t_{ox}$, and can be expressed in terms of the equation:

$$K' = \mu_0 \frac{\epsilon_0}{t_{ox}} \tag{3}$$

Therefore, when the microcircuit is operating in a best case environment, i.e. when Vcc is high (5.5 volts) and the temperature is low, K' is high. As can be seen by equation 2, when k' increases, V1 332 to decreases.

Reference voltage generator 300 generates Vref 232 as a function of Vcc, $\beta$, and V1 332, where $\beta$ is:

$$\beta = \sqrt{\frac{K'}{Kp'}} \tag{4}$$

Kp' is the gain factor of p-channel transistors. Vref 232 expressed in these terms then is:

$$Vref = Vcc - \beta V1 \tag{5}$$

Therefore, when the microcircuit is operating in a best case environment and V1 332 decreases, Vref 232 increases.

4. Example Embodiment for use with 3.0 Volt Systems

As an example of an application of output buffer 200, consider a CMOS microcircuit specified to interface to other integrated circuits at standard TTL (transistor-transistor logic) levels. TTL specifications require a driving integrated circuit to output an output signal at TTL levels. TTL levels require an output signal at 2.4 volts or greater for a high level signal, and at 0.4 volts or less for a low signal. TTL specifications require a receiving integrated circuit to recognize a logic high signal when it receives a signal 2.0 volts or greater, and a logic low signal when it receives a signal at 0.8 volts or less.

In this example, further consider the CMOS circuit interfaced to a power supply with a positive voltage of 5.5 volts. Vcc 132 is 5.5 volts and GND is zero. When n-channel pull-up transistor Q1 is turned on (and pull-down transistor Q2 is turned off), the voltage level of output signal 234 at a node C is dropped to approximately 4.0 volts. This drop is due to a threshold voltage drop across the gate and source of n-channel pull-up transistor Q1. This 4.0 volts is sufficient to meet TTL output device specifications. When n-channel pull-down transistor Q2 is turned on (and pull-up transistor Q1 is turned off), the level of output signal 234 at node C is zero volts. This too is sufficient to meet TTL specifications.

Some electronic and computer systems are designed to operate at a Vcc 132 of 3.0 or 3.3 volts as opposed to 5.0 volts. This design choice may be selected in consideration of system speed, current (power) consumption, operating temperature, or a number of other reasons. Regardless of the reason, if Vcc 132 is selected at 3.0 or 3.3 volts, and pull-up transistor Q1 is an n-channel device, the voltage at node C will not be sufficient to meet the 2.4 volts required by TTL specifications when output signal 234 is a logic high.

Figure 4:
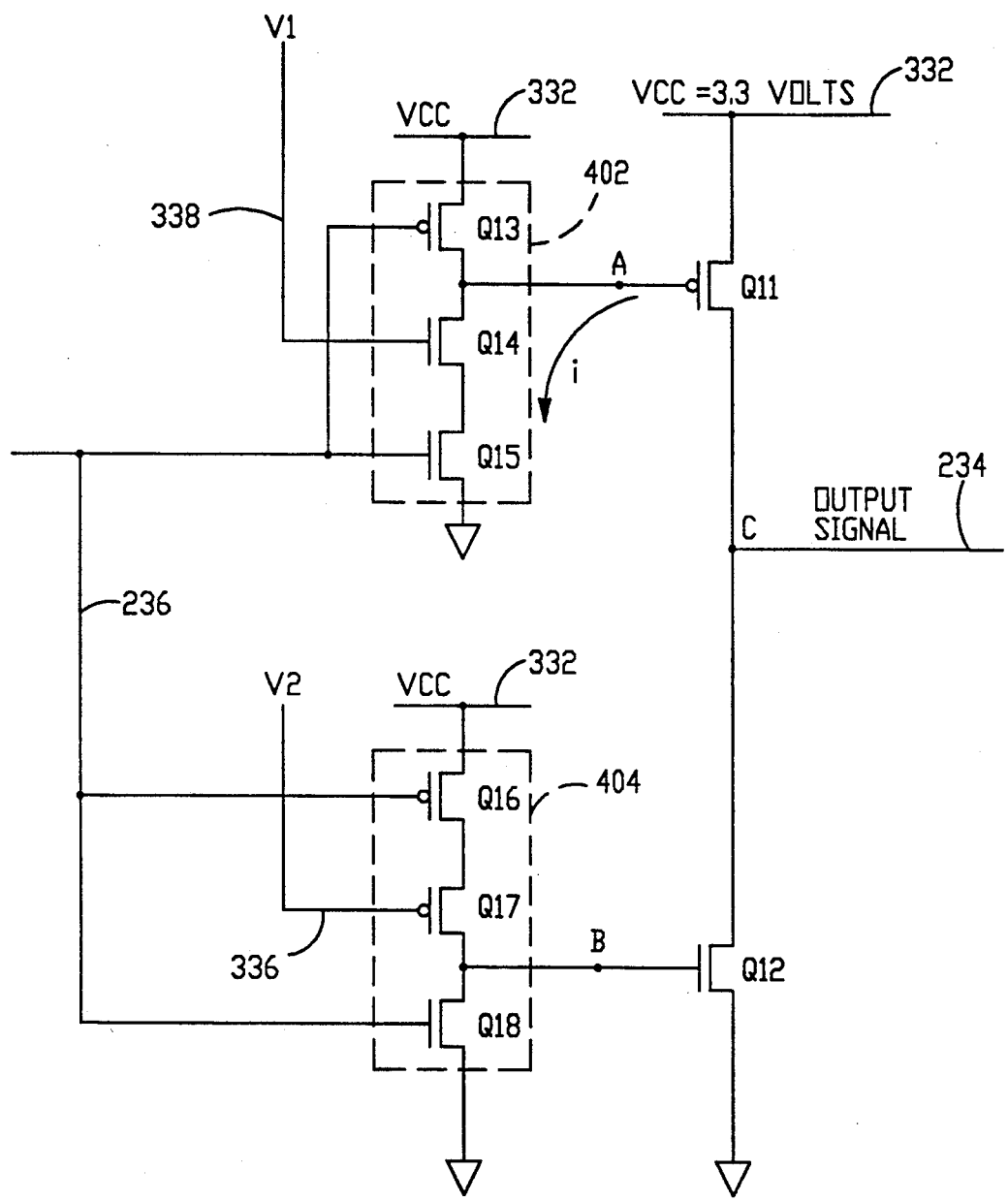
FIG. 4 is a schematic diagram illustrating an output buffer circuit for minimizing ground bounce according to a second embodiment of the present invention.

Thus, a second alternative embodiment can be considered to handle implementations wherein Vcc 132 is 3.0 or 3.3 volts. Referring to FIG. 4, in this second alternative embodiment a pull-up transistor Q11 is implemented as a p-channel FET as opposed to the n-channel FET used in the previous embodiment. Therefore, all of the voltage at Vcc 132 will be transferred to node C when pull-up transistor Q11 is turned on and pull-down transistor Q12 is turned off.

In this embodiment, control of the rise time of output signal 234 is controlled by control circuit 402, while control of the fall time of output signal 234 is controlled by a control circuit 404.

In this second alternative embodiment, a high-to-low transition of output signal 234 is controlled by an n-channel pull down transistor Q12. Operation of pull-down transistor Q12 is identical to the operation of pull-down transistor Q2 of the first alternative embodiment. Consequently, control of the high-to-low transition time of output signal 234 is handled in the same manner as in the first alternative embodiment.

In this second alternative embodiment, control of a low-to-high transition is accomplished by turning on p-channel pull-up transistor Q11. As with the first alternative embodiment, low-to-high transition time of output signal 234 is controlled by controlling the amount of current i at node A. However, because pull-up transistor Q11 is a p-channel device, control of the current at node A must be performed differently in this second alternative embodiment.

Control of current i at node A will now be described according to the second alternative embodiment. To produce a high output signal 234, pull-up transistor Q11 must be turned on and pull-down transistor Q12 must be turned off. Since pull-up transistor Q11 is a p-channel FET, a low signal is required at node A to turn it on. Thus, current i must flow from node A to GND via transistors Q14, Q15. A reference voltage 338 (referred to as 'V1 338') is used to control the amount of current that can flow from node A through transistors Q14, Q15 to ground.

When data 236 transitions from low to high, transistors Q13, Q16 are turned off and transistors Q15, Q18 are turned on. Assuming for a moment that V1 338 is greater than the threshold of Q14, current i flows from node A to ground, thus turning on transistor Q11. This allows transistor Q11 to pass current from Vcc 332 to node C, causing output signal to go high.

To impede the flow of current i from node A to ground, the level of V1 338 is reduced. This puts resistance in the path between node A and ground and thus slows the flow of current i. As a result, pull-up transistor Q11 is turned on more slowly and output signal 234 makes a slower transition from low to high.

5. A Complete Output Buffer Circuit According to the Present Invention.

Figure 5:
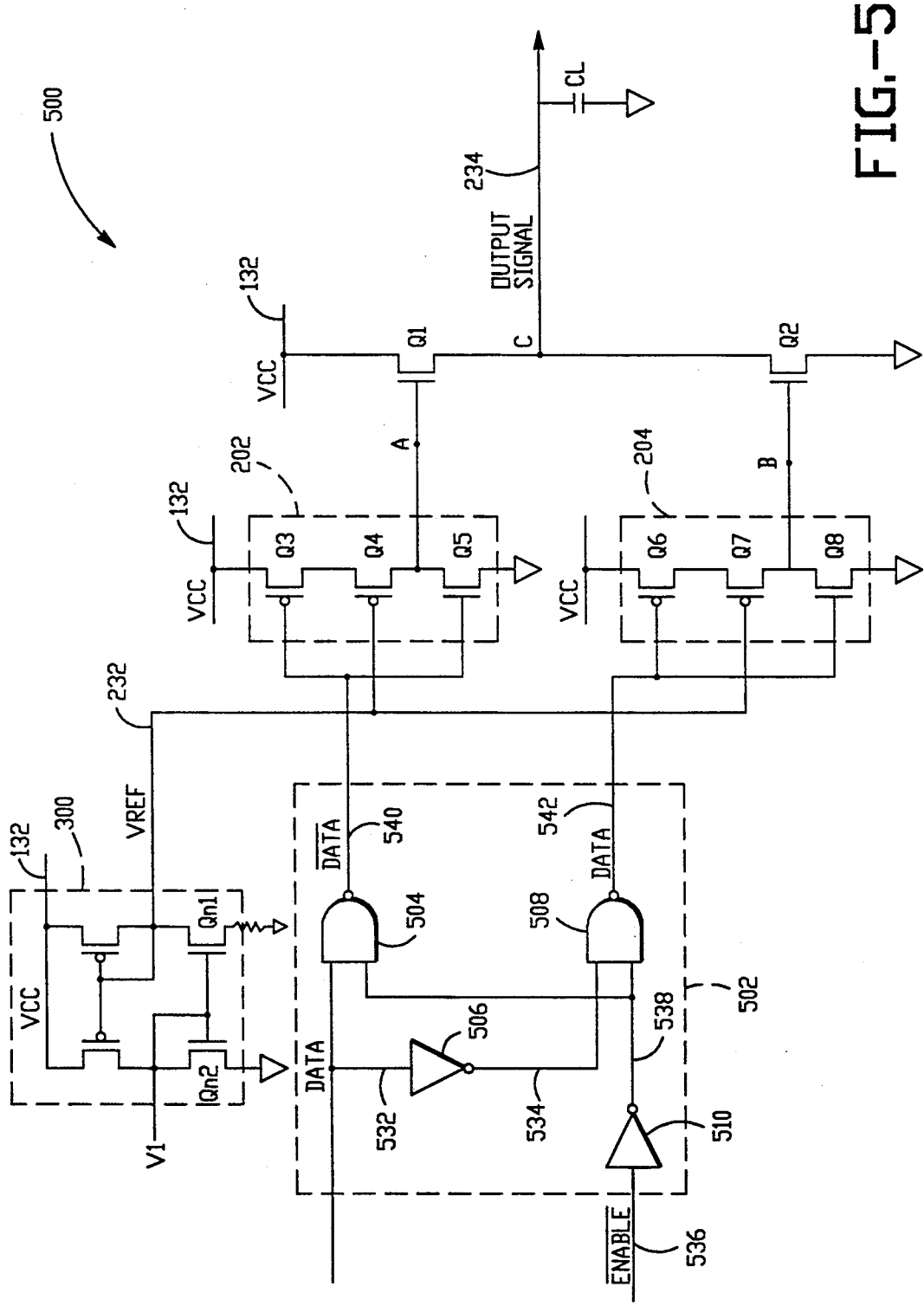
FIG. 5 is a schematic diagram illustrating a complete output buffer circuit according to the first embodiment of the present invention.

FIG. 5 illustrates a complete output buffer 500 including a reference voltage generator 300, an output buffer circuit according to the first alternative embodiment of the present invention, and input circuitry 502. Although input circuitry 502 is illustrated and discussed in conjunction with the first alternative embodiment, it will be readily apparent to one of ordinary skill in the art how to use input circuitry with other alternative embodiments.

Referring to FIG. 5, data 532 to be output at output signal 234 is input to a NAND gate 504 and an inverter 506. Inverted data 534 is input to NAND gate 508. Enable signal 536 is input to inverter 510. Inverted enable signal 538 is input to NAND gates 504, 508. When enable signal 536 is low, indicating an output enable, NAND gate 504 inverts data 532 to form inverted data 540 and NAND gate 508 inverts inverted data 534 to form data 542. If enable signal 536 is high, NAND gates 504, 508 continually output a high signal, thus disabling operation of output buffer 500.

6. Implementation of the Output Buffer Circuit

Figure 6:
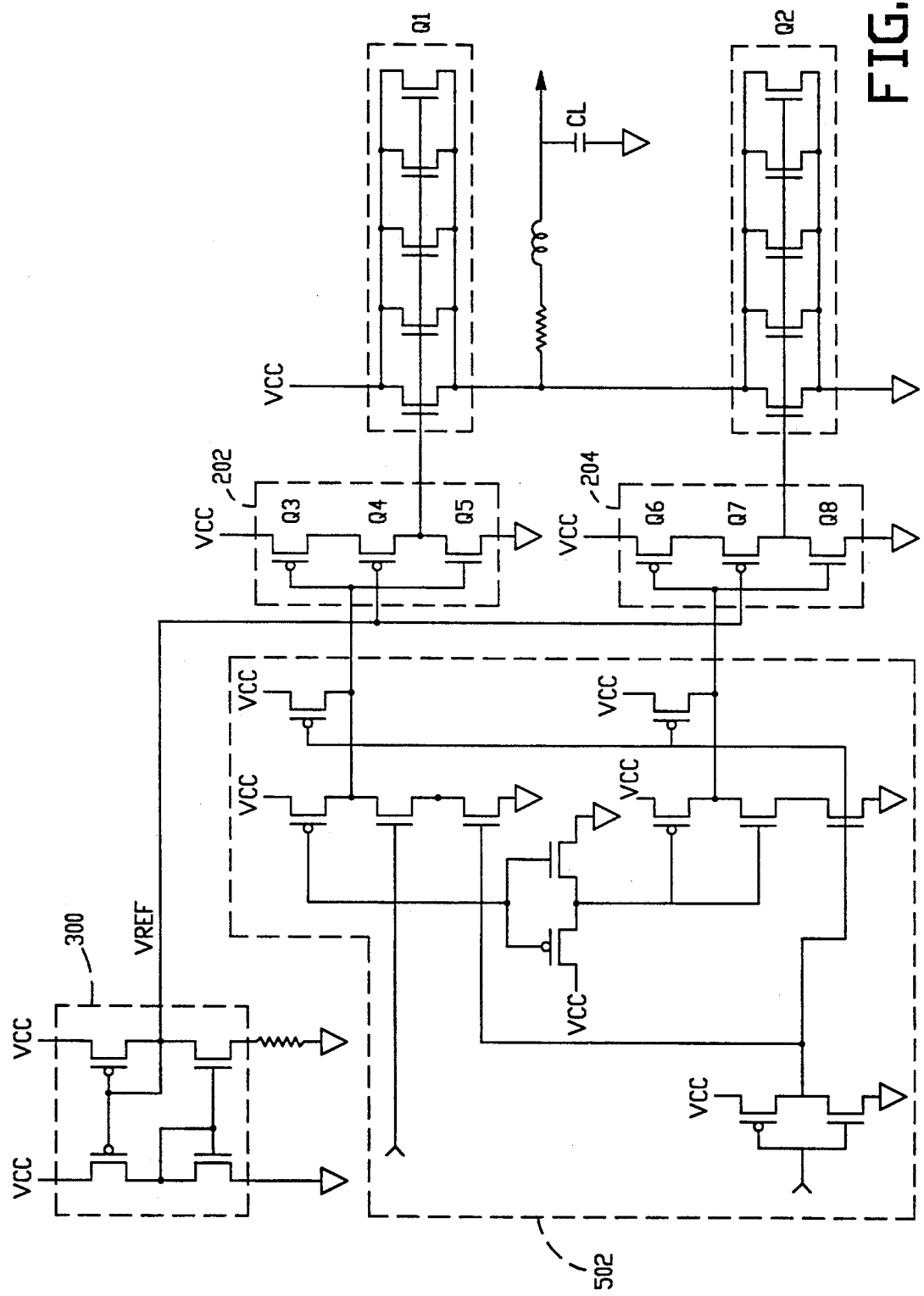
FIG. 6 is a transistor level schematic diagram of the embodiment of FIG. 5.

The output buffer circuit according to the present invention is implemented using n- and p-channel enhancement-mode field-effect transistors of various dimensions. FIG. 6 illustrates a schematic diagram of a complete output buffer circuit 500 at the transistor level. Pull-up transistor Q1 is implemented using six n-channel field-effect transistors each having a width of 68.3 microns and a length of 2.0 microns. Similarly, pull-down transistor Q2 is also implemented using six n-channel field-effect transistors each having a width of 68.3 microns and a length of 2.0 microns.

Control circuit 202 is implemented using 2 p-channel FETs and one n-channel FET. Transistor Q3 is a p-channel FET with a width of 42 microns and a length of 1.2 microns. Transistor Q4 is a p-channel FET with a width of 52 microns and a length of 1.2 microns, and transistor Q5 is an n-channel FET with a width of 37.8 microns and a length of 1.0 microns.

Control circuit 204 is also implemented using two p-channel FETs and one n-channel FET. Transistor Q6 is a p-channel FET with a width of 32 microns and a length of 1.2 microns. Transistor Q7 is a p-channel FET with a width of 40 microns and a length of 1.2 microns, and transistor Q8 is an n-channel FET with a width of 37.8 microns and a length of 1.0 microns.

NAND gates 504, 508 are implemented using two n-channel and two p-channel FETs each. The two n-channel FETs are 21 microns in width and 1.0 micron in length. The two p-channel devices are 21 microns in width and 1.2 microns in length. Inverters 506, 510 are implemented using one n-channel and one p-channel FET each. The n-channel FET is 15 microns wide and 1.0 microns long, and the p-channel FET is 25 microns wide by 1.2 microns long.

Reference voltage generator 300 is implemented using two n-channel and two p-channel FETs and a 3.5 k-ohm resistor.

7. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An output buffer circuit having reduced ground bounce comprising:
    (a) a first terminal for receiving a first power supply voltage;
    (b) a second terminal for receiving a second power supply voltage;
    (c) a pull-up transistor having a first electrode coupled to said first terminal, a second electrode coupled to an output node of the output buffer circuit, and a gate, said pull-up transistor operable to provide a logic high signal at said output node;

(d) a pull-down transistor having a first electrode coupled to said second terminal, a second electrode coupled to said output node of the output buffer circuit, and a gate, said pull-down transistor operable to provide a logic low signal at said output node;

(e) a first control circuit, coupled to said pull-up transistor, comprising, a plurality of transistors having drain-source current paths connected in series between said first and second terminals, at least one of the transistors being supplied with an input data signal at a gate thereof and a further one of the transistors being supplied with a first reference voltage level at the gate thereof, an output terminal at a drain-source connection between two of said transistors, said output terminal coupled to a gate electrode of said pull-up transistor, wherein said first control circuit is configured to control current flowing to said gate of said pull-up transistor to increase a transition time thereof;

(f) a second control circuit, coupled to said pull-down transistor, comprising, a plurality of transistors having drain-source current paths connected in series between said first and second terminals, at least one of the transistors being supplied with an input data signal at a gate thereof and a further one of the transistors being supplied with a second reference voltage level at the gate thereof, an output terminal at a drain-source connection between two of said transistors, said output terminal coupled to a gate electrode of said pull-down transistor, wherein said second control circuit is configured to control current flowing to said gate of said pull-down transistor to increase a transition time thereof; and (g) a voltage generator circuit for producing said first reference voltage level, comprising, a first p-channel field-effect transistor connected to said first power supply voltage, a first n-channel field-effect transistor connected in series to said first p-channel field-effect transistor thereby forming a first node at the series connection, and a resistive device having a first terminal connected to said first n-channel field-effect transistor and a second terminal connected to said second power supply voltage, a second p-channel field-effect transistor and a second n-channel field-effect transistor connected in series between said first and second power supply voltage and forming a second node at their series connection, and wherein, the gates of said first and second p-channel field-effect transistors are connected to said first node to provide said first reference voltage level and the gates of said first and second n-channel field-effect transistors are connected to said second node to provide a third reference voltage level.

2. The output buffer circuit according to claim 1, wherein said transistors are MOS field-effect transistors.

3. The output buffer circuit according to claim 1, wherein said second reference voltage level is the same as said first reference voltage level.

4. The output buffer circuit according to claim 1, wherein said second reference voltage level is said third reference voltage level.

5. The output buffer circuit according to claim 1, wherein said first and second control circuits each comprise:

(a) a first field effect transistor having a first electrode connected to said first terminal, and said input data signal supplied is at a gate thereof;

(b) a second field effect transistor having a first electrode connected to a second electrode of said first field effect transistor, a second electrode coupled to said output terminal, and a gate electrode for receiving said first reference voltage level; and (c) a third field effect transistor having a first electrode connected to said second electrode of said second field effect transistor, a second electrode coupled to said second terminal, and a gate electrode for receiving said input data signal.

6. The output buffer circuit according to claim 5, further comprising a data inverter, coupled to the gate of said first and third field effect transistors of at least one of said first control circuit and said second control circuit, for inverting said input data signal.

7. The output buffer circuit according to claim 1, wherein said first and second control circuits each comprise:

(a) a first field effect transistor having a source electrode connected to said first terminal and said input data signal supplied at a gate thereof;

(b) a second field effect transistor having a source electrode connected to the drain electrode of said first field effect transistor, a drain electrode coupled to said output terminal, and a gate electrode for receiving said first reference voltage level; and (c) a third field effect transistor having a drain electrode connected to said drain electrode of said second field effect-transistor, a source electrode coupled to said terminal, and a gate electrode for receiving said input data signal.

8. The output buffer circuit according to claim 7, further comprising a data inverter, coupled to the gate of said first and third field effect transistors of at least one of said first control circuit and said second control circuit, for inverting said input data signal.

9. The output buffer circuit according to claim 1, wherein said first control circuit comprises, (a) a first field effect transistor having a source electrode connected to said first terminal, said input data signal supplied at a gate thereof, and a drain electrode connected to said output terminal;

(b) a second field effect transistor having a drain electrode connected to said output terminal, and a gate electrode for receiving said first reference voltage level; and (c) a third field effect transistor having a drain electrode coupled to a source electrode of said second field effect transistor, a source electrode coupled to said second terminal and a gate for receiving said input data signal; and wherein said second control circuit comprises (d) a first field effect transistor having a source electrode connected to said first terminal and said input data signal supplied at a gate thereof;

(e) a second field effect transistor having a source electrode connected to the drain electrode of said first field effect transistor, a drain electrode coupled to said output terminal, and a gate electrode for receiving said third reference voltage level; and (f) a third field effect transistor having a drain electrode connected to said drain electrode of said second field effect transistor, a source electrode coupled to said terminal, and a gate electrode for receiving said input data signal.

10. An output buffer circuit having reduced ground bounce, comprising:

(a) first means for generating a logic-high data output signal at an output node of the output buffer circuit;

(b) second means, coupled to said first means, for generating a logic-low data output signal at said output node of the output buffer circuit;

(c) third means, coupled to said first means, for supplying a controlled amount of current to said first means, thereby adjusting a first transition time for turning on said first means;

(d) fourth means, coupled to said second means, for supplying a controlled amount of current to said second means, thereby adjusting a second transition time for turning on said second means; and (e) fifth means, coupled to said third and said fourth means, comprising two p-channel field-effect transistors and two n-channel field-effect transistors, for generating a first reference voltage signal, wherein said first reference voltage signal controls said amount of current supplied by said third and said fourth means.

11. An output buffer circuit having reduced ground bounce, comprising:

(a) first means for generating a logic-high data output signal at an output node of the output buffer circuit;

(b) second means, coupled to said first means, for generating a logic-low data output signal at said output node of the output buffer circuit;

(c) third means, coupled to said first means, for supplying a controlled amount of current to said first means, thereby adjusting a first transition time for turning on said first means;

(d) fourth means, coupled to said second means, for supplying a controlled amount of current to said second means, thereby adjusting a second transition time for turning on said second means; and (e) fifth means, coupled to said third and fourth means, comprising two p-channel and two n-channel field-effect transistors, for generating a first and second reference voltage signal, wherein said first reference voltage signal provides said controlled amount of current supplied by said third means and said second reference voltage signal provides said controlled amount of current supplied by said fourth means.

* * * * *